United States Patent [19]

Harigai

[11] Patent Number: 5,763,944
[45] Date of Patent: *Jun. 9, 1998

[54] SEMICONDUCTOR DEVICE HAVING A REDUCED WIRING AREA IN AND OUT OF DATA PATH ZONE

[75] Inventor: Hisao Harigai, Tokyo, Japan

[73] Assignee: NEC Corporation, Tokyo, Japan

[*] Notice: The term of this patent shall not extend beyond the expiration date of Pat. No. 5,583,374.

[21] Appl. No.: 687,042

[22] Filed: Jul. 25, 1996

Related U.S. Application Data

[63] Continuation of Ser. No. 283,632, Aug. 1, 1994, Pat. No. 5,583,374.

[51] Int. Cl.⁶ .............................. H01L 23/50; H01L 23/52
[52] U.S. Cl. .................... 257/690; 257/688; 257/689; 257/691; 257/693; 257/700
[58] Field of Search .............................. 257/688, 689, 257/690, 691, 693, 700

[56] References Cited

U.S. PATENT DOCUMENTS 5,583,374  12/1996  Harigai .................... 257/690

FOREIGN PATENT DOCUMENTS 61198751  9/1986  Japan .
2-155267  6/1990  Japan .
3225697  10/1991  Japan .

*Primary Examiner*—Tom Thomas
*Assistant Examiner*—Fetsum Abraham
*Attorney, Agent, or Firm*—Whitham, Curtis & Whitham

[57] ABSTRACT

A semiconductor device formed on a semiconductor chip includes a signal processing unit composed of a plurality of signal processing cells arranged side by side in a horizontal direction, and a plurality of input/output cells each connected to a corresponding one of the signal processing cells in a one-to-one relation. The signal processing unit is located near to one corner of the semiconductor chip, and the input/output cells are uniformly distributed and located along two sides defining the above mentioned corner. Each of the signal processing cells is configured to make it possible that a wiring conductor connecting between the signal processing cell and a corresponding one of the input/output cells is taken out either in an upward vertical direction or in a downward vertical direction from the signal processing cell, in accordance with the side of the semiconductor chip along which the corresponding input/output cell is located.

10 Claims, 5 Drawing Sheets

SEMICONDUCTOR DEVICE HAVING A REDUCED WIRING AREA IN AND OUT OF DATA PATH ZONE

CROSS REFERENCE TO RELATED APPLICATION

This application is a continuation of application Ser. No. 08/283,632 filed Aug. 1, 1994, which is patented (U.S. Pat. No. 5,583,374) on Dec. 10, 1996.

BACKGROUND OF THE INVENTION

1. Field of the Invention

The present invention relates to a layout of a semiconductor device such as a microprocessor, and more specifically to a floor plan of wirings connecting between output pads or input/output pads and circuits for generating or processing signals to or from these pads.

2. Description of Related Art

Microprocessors of 32-bit machine include hardware (data path) for generating address information of a 32-bit length and processing data of a 32-bit length. This data path is constituted by vertically arranging a plurality of units for generating a 32-bit length address or processing a 32-bit length data. Each of the units is composed by arranging 32 layout cells, called a leaf cell, each corresponding to one bit, in a horizontal direction in the order of the bit number in accordance with a given rule. The units within the data path are interconnected through a plurality of buses having a 32-bit length, for exchange of data. These buses are constituted of signal lines formed of metal wiring conductors. The leaf cells of each unit are designed or laid out to the effect that, when the plurality of units are arranged vertically, the wiring conductors of the buses depict a straight line.

On the other hand, the microprocessors of 32-bit machine include 32 address output cells and 32 data input/output cells. The address output cells are provided for outputting address information of one bit to an external of a microprocessor chip, and each of the address output cells is constituted of a bonding pad, an output buffer, and a control circuit for the output buffer. Similarly, each of the data input/output cells is constituted of a bonding pad, an input/output buffer, and a control circuit for the input/output buffer.

The 32 address output cells and the 32 data input/output cells are respectively connected to corresponding ones of the plurality of units which constitute the data path, through a bundle of metal wiring conductors. Namely, an external address generation unit, which cooperates with other units for generating an external address information, are connected to the address output cells through 32 metal wiring conductors. A data generating and processing unit for generating an output data and for processing an input data, are connected to the data input/output cells through 32 metal wiring conductors.

Referring to FIG. 1, there is shown a conventional floor plan illustrating an address output arrangement of the 32-bit microprocessor. A microprocessor 300 is fabricated in accordance with a semiconductor manufacturing process in which at least two levels of metal wiring conductors and one level of polysilicon wiring conductor are formed. Here, a lower level of the two-level wiring conductors will be called a "first level metal wiring conductor", and an upper level of wiring conductor will be called a "second level metal conductor".

In FIG. 1, only an external address generation unit 302 and an internal address generation unit 304 are depicted for simplification of the drawings, but it it to be understood that a number of units (not shown) are actually arranged in a vertical direction. These units are interconnected through three groups of internal interconnection buses (not shown) extending in parallel to a vertical side 306 of the microprocessor chip. In the shown example, these internal interconnection buses (not shown) are constituted of the second level metal wiring conductors.

Within the external address generation unit 302, a bus for connecting to address output cells 301 (which are hyphened with suffixes "0" to "31" for mutual distinction of respective bits) is provided in addition to the above mentioned three groups of internal interconnection buses. Namely, 32 address output terminals 325 (which are also hyphened with suffixes "0" to "31" for mutual distinction of respective bits) formed on a lower side of the external address generation unit 302 are respectively connected to the address output cells 301-0 to 301-31 through wiring conductors 305 (which are hyphened with suffixes "0" to "31" for mutual distinction of respective bits).

Furthermore, to the external address generation unit 302 are connected a plurality of control wiring conductors (not shown) for transmitting control signals generated in an external address generation controller 303. These control wiring conductors (not shown) are formed of the first level metal wiring conductors, which extend in parallel to opposite horizontal sides 307 and 308 of the microprocessor chip, so as to traverse over a full length of the external address generation unit 302. Within the external address generation unit 302, there are provided four 32-bit registers, a one-out-of-four selector (four-input selector) having four inputs connected to outputs of the four registers, respectively, for selecting and outputting one of the four inputs, and an address incrementer of a 32-bit width, all of which are not shown. These registers, selector and incrementer are controlled by the control signals generated in the external address generation controller 303.

The external address generation unit 302 is constituted of 32 address generation cells (not shown), each of which is configured to generate one bit of external address, which is outputted through an one-bit address output terminal 325-31 to 325 31 provided for each address generation cell. Each of the address generation cells is constituted of four one-bit registers, a one-out-of-four selector, and one full address (all of which are not shown in FIG. 1). The 32 address generation cells are arranged in such a manner that, when the external address generation unit is arranged together with other units, the wiring conductors of the buses straightly extend in parallel to each other. On the other hand, the external address generation controller 303 generates four groups of strobe signals for the respective registers, four selection signals for the one-out-of-four selector, which are supplied in common to the 32 address generation cells through the above mentioned control wiring conductors (not shown).

Referring to FIG. 2, there is shown a block diagram illustrating the construction of the address generation cell, which is generally designated by Reference Numeral 400. The address generation cell 400 four one-bit registers 401, 402, 403 and 404, a one-bit latch 405, a one-out-of-four one-bit selector 406 and a one-bit full adder 407.

Reference Numerals 408, 409 and 427 designate wiring conductors constituting the three groups of buses for internal wirings within the data path. The wiring conductor 427 is used for interconnection with the internal address generation unit 304. The wiring conductors 408 and 409 are connected to two inputs of the register 404, and the wiring conductor 427 is connected to one input of the latch 405. In the layout, these wiring conductors 408, 409 and 427 pass above the leaf cell of the address generation cell 400, and connected to an internal circuit of the address generation cell 400 through contact holes formed at suitable positions.

Reference Numerals 410 to 424 designate control wiring conductors extending from the external address generation controller 30 shown in FIG. 1. These control wiring conductors 410 to 424 are also connected to the internal circuit of the address generation cell 400 through contact holes formed at suitable positions. The control wiring conductor 410 is used for transmitting a clock applied to the latch 405 as a latch signal, and the control wiring conductors 411 and 412 are used to supply a pair of strobe signals to the register 401. The control wiring conductors 413 and 414 are used to supply a pair of strobe signals to the register 402, and the control wiring conductors 415 and 416 are used to supply a pair of strobe signals to the register 403. The control wiring conductors 417, 418 and 419 are used to supply a pair of strobe signals to the register 404, and the control wiring conductors 420, 421, 422 and 423 are used to supply selection signals to the one-out-of-four selector 406.

For simplification of the drawing, in FIG. 2, only one wiring conductor connected to a gate of an N-channel MOS transistor is depicted as each of the control wiring conductors, but it should be understood that, another one wiring conductor connected to a gate of a P-channel MOS transistor is formed in the actual layout.

The control wiring conductor 424 is provided to give a mask signal against the selector 406. For this purpose, the control wiring conductor 424 is connected to one input of an OR circuit 430, which in turn has its other input connected to an output of the selector 406. An output of the OR circuit 430 is connected to an address output terminal 425 for outputting an output signal from the address generation cell 400 to the address output cell 301. This address output terminal 425 is also connected to an input of the full adder 407.

Reference Numeral 426 shows a signal line for transmitting a carry output of the full adder 407, and Reference Numeral 428 indicates a signal line for transmitting a carry output to be supplied to the full adder 407. Reference Numeral 429 designates a signal line for transmitting an output signal of the full adder 407, and the signal line 429 is connected through an inverter 431 to one input of each of the four registers 401, 402, 403 and 404. An output of the latch 405 is connected through two cascaded inverters 432 and 433 to the other input of each of the registers 401, 402 and 403.

The control wiring conductors 410 to 424 are constituted of the first level conductors which extend in a horizontal direction in FIG. 1 and which are formed in common to the 32 address generation cells within the external address generation unit 302. In the layout, the signal lines 426 and 428 are formed of the first level conductors extending in the horizontal direction in FIG. 1. The wiring conductors 408, 409 and 427 are common to a leaf cell of each bit within the data path, and, are, in the actual layout, formed of the second level metal wiring conductors extending in a vertical direction in FIG. 1. The signal line 429 is used for transmitting an internal signal within the address generation cell 400.

Referring to FIG. 3, there is shown a layout diagram of the second level wiring conductors within the address generation cell. In FIG. 3, a cell 500 corresponds to the address generation cell 400 in FIG. 2. In addition, wiring conductors 508, 509 and 527, an address output terminal 525 and a signal line 529 in FIG. 3 correspond to the wiring conductors 408, 409 and 427, the signal line 429 in FIG. 2, respectively.

Here, a wiring for connecting the address output terminal 525 to the address output cell 301 will be explained. The address output terminal 525 is located at a lower end of the address generation cell 500. A lead-out line cannot be taken out from the address output terminal 525 toward an upper end of the address generation cell 500, since it conflicts the signal line 529 of the second level metal wiring conductor. Accordingly, a lead-out line from the address output terminal 525 is taken out from only the lower end of the address generation cell 500.

As shown in FIG. 1, the 32 address output cells 301-0 to 301-15 are arranged along the side 306 of the microprocessor chip 300. On the other hand, the external address generation unit 302 is located at a position which is different from an end of the data path. Specifically, within the data path, other units exist between the external address generation unit 302 and each of the sides 307 and 308 of the microcomputer chip. The address output terminals 325 of the external address generation unit 302 in FIG. 1 correspond to the address output terminal 525 shown in FIG. 3.

As shown in FIG. 1, the wiring conductors 305-0 to 305-31 between the external address generation unit 302 and the address output cells 301-0 to 301-31 are formed by downward taking out from the 32 address output terminals 325-0 to 325-31 by means of the second level metal wiring conductor, and then changing to the first level metal wiring conductor firstly extending to the side 306 of the microprocessor chip 300 in a horizontal direction and further upward or downward extending in a vertical direction.

In the case that the wiring conductors between the external address generation unit 302 and the address output cells 301 are formed as mentioned above, a wiring area for the 32 first level metal wiring conductors is required between the external address generation unit 302 and the internal address generation unit 304. In addition, as will be understood from FIG. 1, a wiring area for 16 first level metal wiring conductors is required between the external address generation unit 302 and the internal address generation unit 304 and the address output cells 301-0 to 301-31 located along the side 306 of the chip 300. The wiring area of the latter case is a minimum value, but an increase area becomes necessary if a central position of a row of the address output cells (the address output cell 301-15) is deviated or separated from a center of the former wiring area (a center of an area between the external address generation unit 302 and the internal address generation unit 304).

Here, trace the wiring conductor for each bit. For example, the wiring conductor 305-0 connecting between the address output terminal 325-0 to the address output cell 301-0 is formed by the second level metal wiring conductor extending form the output terminal 325-0 formed on the lower side of the external address generation unit 302, in parallel to the side 306 of the chip 300, over a length corresponding to a width of the wiring area for the 32 first level metal wiring conductors. This second level metal wiring conductor is connected to the first level metal wiring conductor, which extends toward the side 306 of the chip 300, in parallel to the side 307 of the chip 300, over a width of the data path to the right side of the data path. At the right side of the data path, the first level metal wiring conductor is bent into a downward direction to extend to a level of the address output cell 301-0, and then, also bent into a horizontal direction so as to extend to the address output cell 301-0, in parallel to the side 307 of the chip 300, over a length corresponding to a width of the wiring area for the 16 first level metal wiring conductors.

On the other hand, the wiring conductor 305-15 connecting between the address output terminal 325-15 to the address output cell 301-15 is formed by the second level metal wiring conductor extending form the output terminal 325-15 formed on the lower side of the external address generation unit 302, in parallel to the side 306 of the chip 300, over a length corresponding to a width of the wiring area for the 16 first level metal wiring conductors. This second level metal wiring conductor is connected to the first level metal wiring conductor, which extends toward the side 306 of the chip 300, in parallel to the side 307 of the chip 300, over a half of the width of the data path. At the right side of the data path, the first level metal wiring conductor further extends straightly to the address output cell 301-15, in parallel to the side 307 of the chip 300, over a length corresponding to a width of the wiring area for the 16 first level metal wiring conductors.

In the above mentioned conventional example, the total length of the wiring conductor 305-0 reaches about 2.56 times the total length of the wiring conductor 305-15.

In conclusion, since the conventional example is so configured that the wiring conductor taken out from the address generation cell can be extended only a downward direction, the following problems have been encountered:

(1) A wiring area corresponding to the number of the address bits is required in a direction of taking out the wiring conductor from the address generation cell. In other words, a large wiring area is required within the data path zone.

(2) Between the data path zone and the output cell zone (output terminal zone), a wiring area corresponding to at least a half of the number of the address bits is required. In other words, a large wiring area is required at an outside of the data path.

As a result, (3) Since a necessary chip area increases by the two wiring areas, a chip cost correspondingly increases.

(4) The wiring conductor 427 extending from the internal address generation unit 304 is inevitably increased by the width of the wiring area mentioned in the above item (1), and therefore, a bus transmission rate of the wiring conductor 427 correspondingly drops.

In order to compensate the drop of the bus transmission rate, if the size of an output buffer (not shown) within the internal address generation unit 304 has to be made large, the area of the unit 304 becomes large. This increases the chip cost and the consumed electric power.

(5) Since the wiring conductors 305 extending from the address output terminals 325 to the address output cells 301 become long, an address transmission rate of the wiring conductor 305 correspondingly drops.

In order to compensate the drop of the transmission rate, if the size of an output buffer (not shown) within each address generation cell has to be made large, the area of the address generation cell becomes large. This increase the chip cost and the consumed electric power.

(6) As mentioned above, since a large difference exists between the longest one and the shortest one of the wiring conductors 305, the address transmission rate through the wiring conductors 305 is different from one bit to another bit, a timing design becomes difficult.

SUMMARY OF THE INVENTION

Accordingly, it is an object of the present invention to provide a semiconductor device which has overcome the above mentioned defect of the conventional one.

Another object of the present invention is to provide a semiconductor device having a reduced wiring area in the inside and the outside of the data path zone so as to reduce the chip cost, and having a reduced difference in length between the longest one and the shortest one of the wiring conductors so as to make the timing design easier.

The above and other objects of the present invention are achieved in accordance with the present invention by a semiconductor device formed on a semiconductor chip and including a signal processing unit composed of a plurality of signal processing cells arranged side by side in a horizontal direction, and a plurality of input/output cells each connected to a corresponding one of the signal processing cells in a one-to-one relation, each of the signal processing cells being configured to make it possible that a wiring conductor connecting between the signal processing cell and a corresponding one of the input/output cells can be taken out upward or downward in a vertical direction from the signal processing cell.

Here, the term "input/output cell" used in the specification and in the claims should be understood to include not only an input/output cell having both of a function of outputting a signal to an external and a function of receiving a signal from an external, but also an output cell having only a function of outputting a signal to an external.

According to another aspect of the present invention, there is provided a semiconductor device formed on a semiconductor chip and including a signal processing unit composed of a plurality of signal processing cells arranged side by side in a horizontal direction, and a plurality of input/output cells each connected to a corresponding one of the signal processing cells in a one-to-one relation, the signal processing unit being located near to one corner of the semiconductor chip, the input/output cells being uniformly distributed and located along two sides defining the above mentioned corner therebetween, each of the signal processing cells being configured to make it possible that a wiring conductor connecting between the signal processing cell and a corresponding one of the input/output cells is taken out upward or downward in a vertical direction from the signal processing cell, in accordance with the side of the semiconductor chip along which the corresponding input/output cell is located.

The above and other objects, features and advantages of the present invention will be apparent from the following description of preferred embodiments of the invention with reference to the accompanying drawings.

DESCRIPTION OF THE PREFERRED EMBODIMENTS

Figure 3:
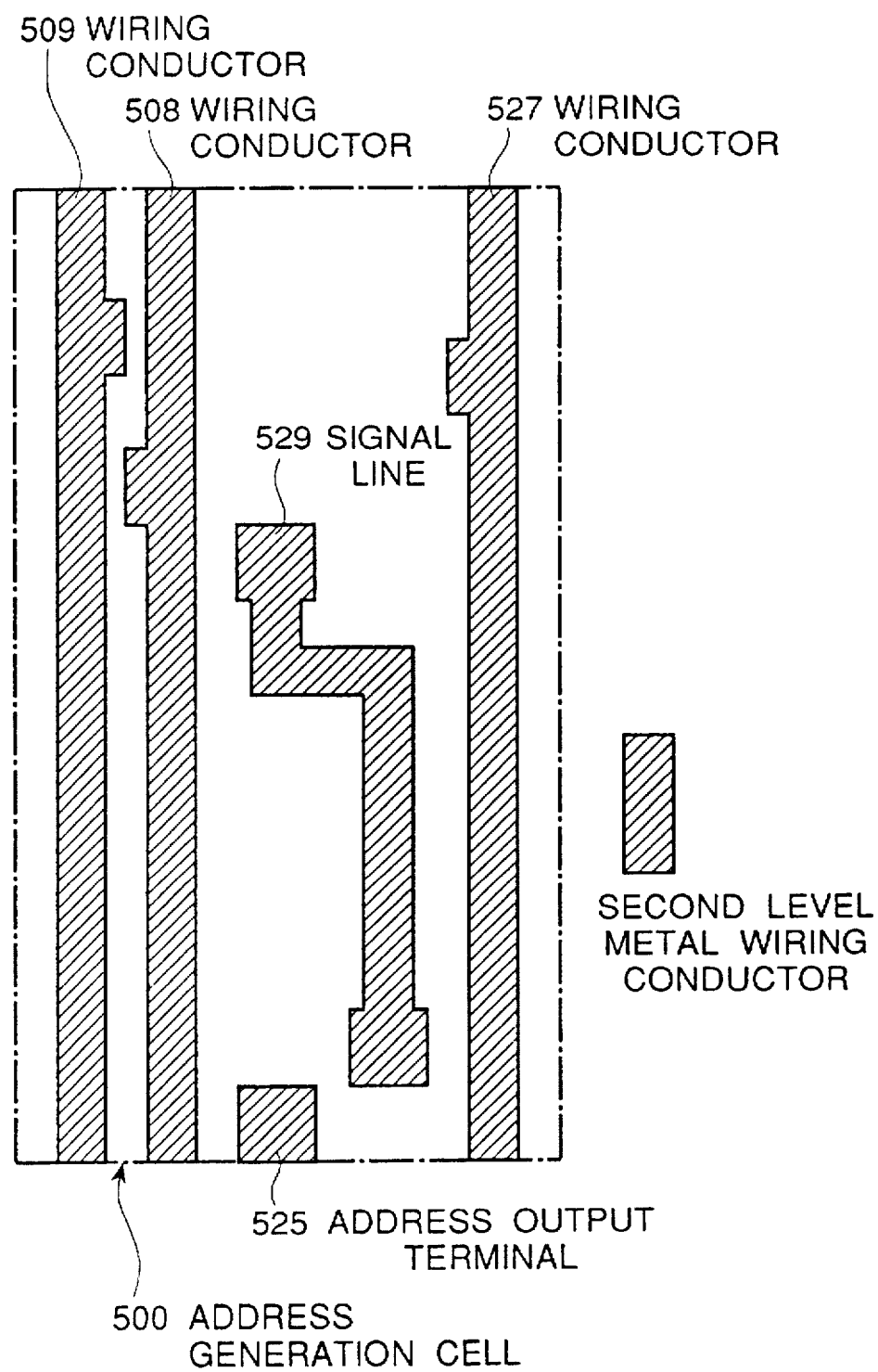
FIG. 3 is a layout diagram of the second level wiring conductors within the address generation cell in the conventional 32-bit microprocessor shown in FIG. 1.
Figure 4:
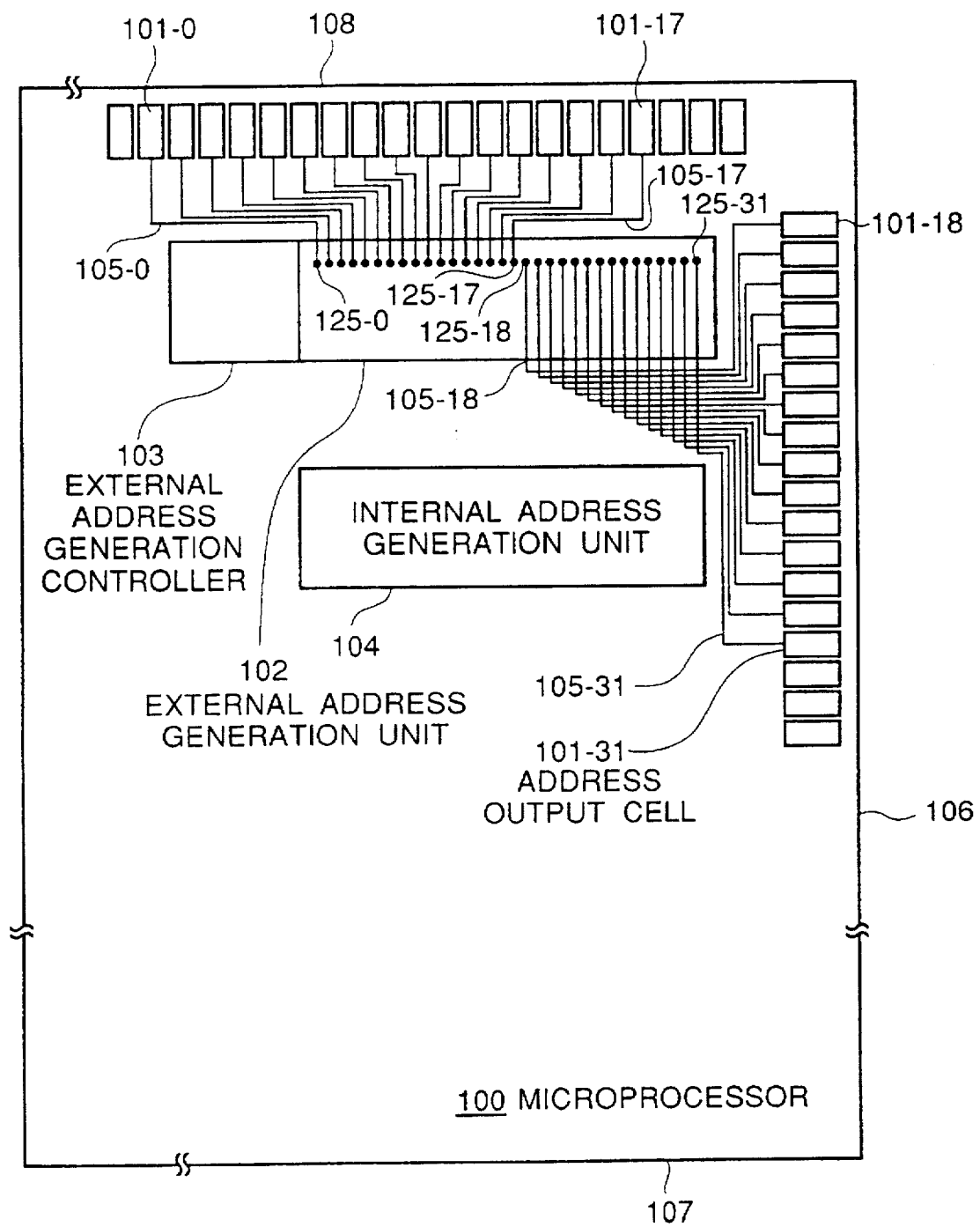
FIG. 4 is a floor plan diagram illustrating an address output pad arrangement of a 32-bit microprocessor which is one embodiment of the semiconductor device in accordance with the present invention.
Figure 5:
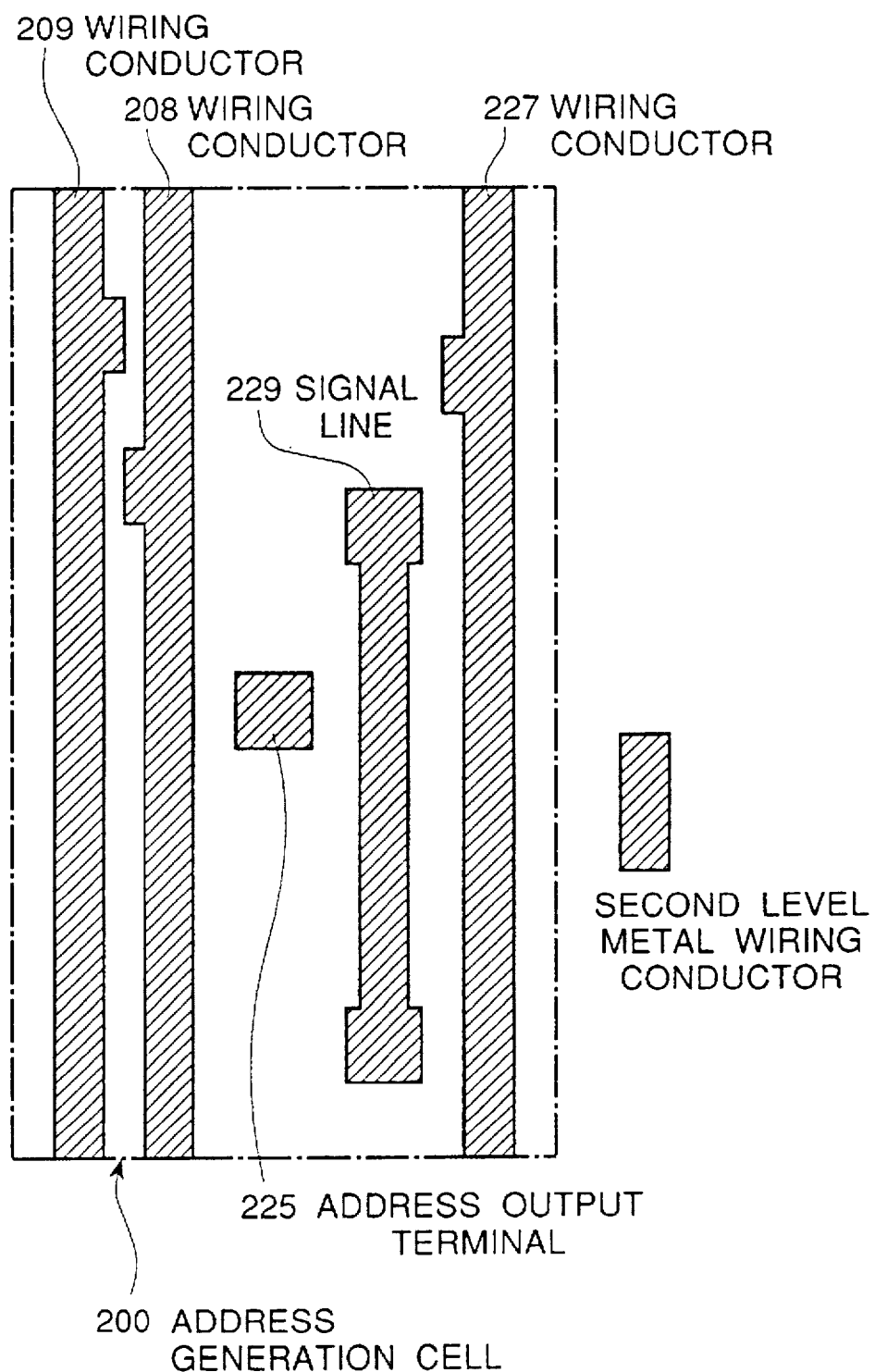
FIG. 5 is a layout diagram of the second level wiring conductors within the address generation cell in the 32-bit microprocessor shown in FIG. 4.

Referring to FIG. 4, there is shown a floor plan diagram illustrating an address output pad arrangement of a 32-bit microprocessor which is one embodiment of the semiconductor device in accordance with the present invention. FIG. 5 is a layout diagram of the second level wiring conductors within the address generation cell in the 32-bit microprocessor shown in FIG. 4. In the following, explanation will be focused to a difference between the embodiment of the present invention and the conventional example shown in FIGS. 1 to 3, and explanation will be omitted in connection with features similar or common to the conventional example.

First, the second level metal wiring conductor in an address generation cell 200 will be described. The address generation cell 200 has a function similar to that of the address generation cell 500 in the conventional example, and therefore, includes an internal circuit structure similar to that shown in FIG. 2. Wiring conductors 208, 209 and 227, an address output terminal 225 and a signal line 229 shown in FIG. 5 correspond to the wiring conductors 508, 509 and 527, the address output terminal 525 and the signal line 529 shown in FIG. 3, respectively.

Figure 2:
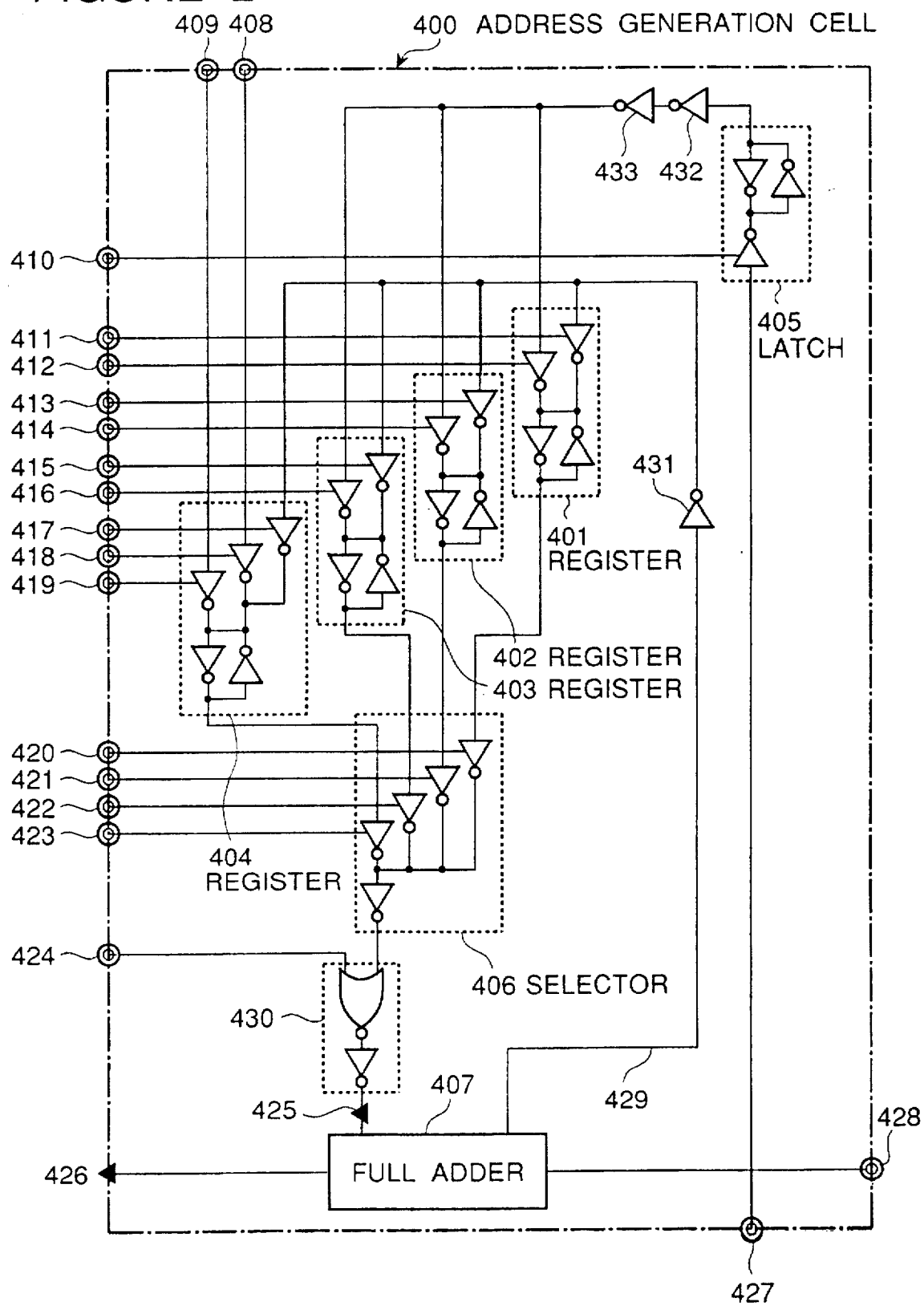
FIG. 2 is a block diagram illustrating the construction of the address generation cell incorporated in the conventional 32-bit microprocessor shown in FIG. 1.

As will be apparent from comparison between FIGS. 3 and 5, the layout of the second level metal wiring conductors in the address generation cell 200 is different from that in the conventional address generation cell 500 shown in FIG. 3, in a positional relation between the output terminal 425 and the signal line 429 shown in FIG. 2. In the conventional example shown in FIG. 3, the output terminal 525 is located at the lower side of the address generation cell 500, but a second level metal wiring conductor cannot be taken out from the output terminal 525 toward an upper side of the cell 500 because it will be obstructed by the signal line 529 which is also formed of the second level metal wiring conductor. Although the first level metal wiring conductor is not shown in FIG. 3, since 31 first level metal wiring conductors including the control wiring conductors are distributed, it is extremely difficult to avoid or bypass the signal line 529 by utilizing the first level metal wiring conductor.

On the other hand, in the embodiment shown in FIG. 5, the output terminal 225 is located at a center position of the cell 200, and the signal line 229 is made straight in parallel to the wiring conductors 209, 208 and 227. With this arrangement, a second level metal wiring conductor cannot be taken out from the output terminal 225 in a vertical direction either toward an upper side of the cell 200 or toward a lower side of the cell 200, because the take-out second level metal wiring conductor will in no way be obstructed by the signal line 229 which is also formed of the second level metal wiring conductor.

Next, with reference to FIG. 4, explanation will be made on wiring between address output cells and an external address generation unit 102 laid out by using the address generation cells 200 constructed as shown in FIG. 5.

Figure 1:
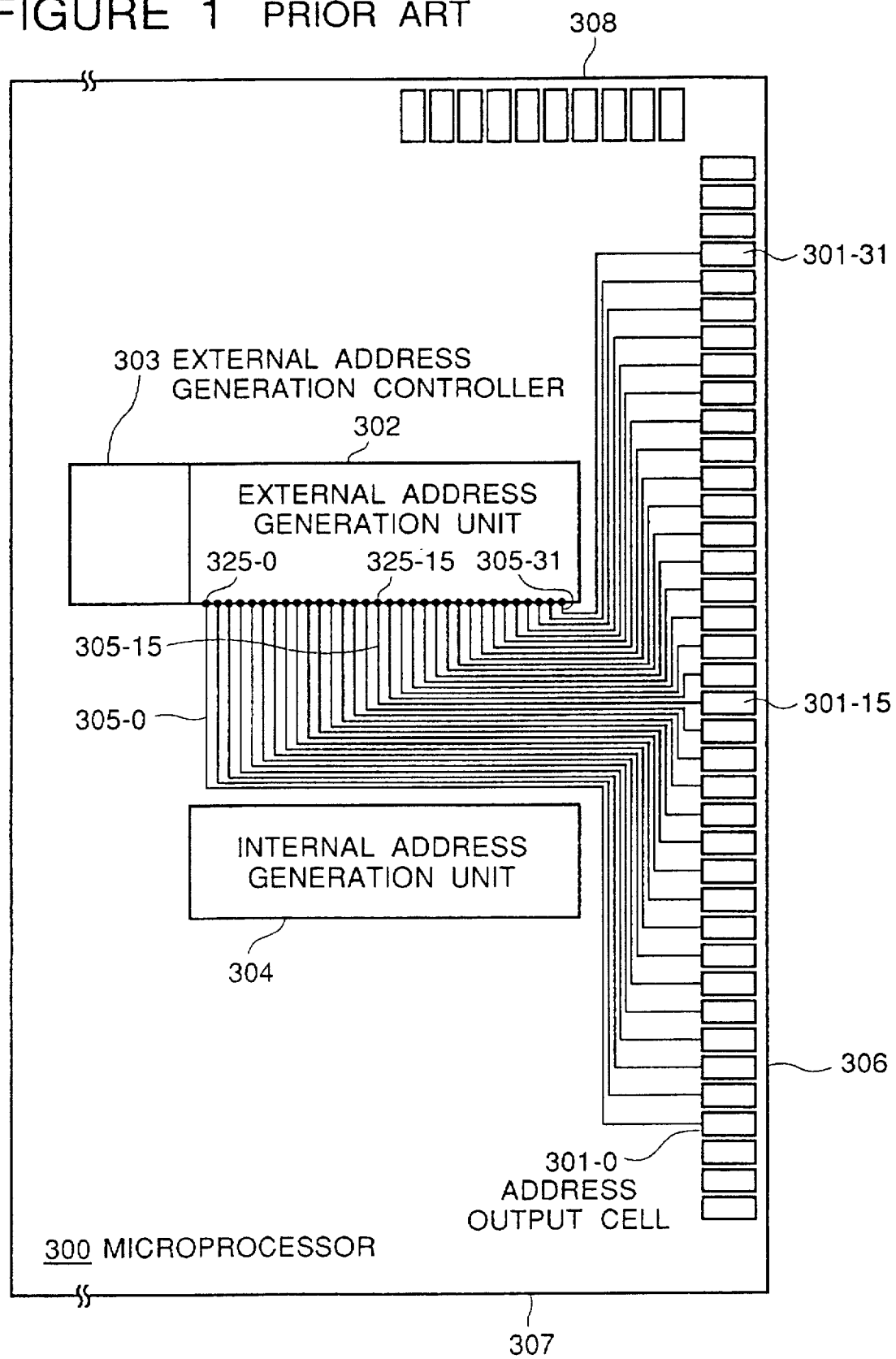
FIG. 1 is a floor plan diagram illustrating an address output pad arrangement of a conventional 32-bit microprocessor.

In FIG. 4, Reference Numeral 100 generally designates a microprocessor chip, and Reference Numeral 101 indicates address output cells, which are hyphened with suffixes "0" to "31" for mutual distinction of respective bits, similarly to the example shown in FIG. 1. Reference Numeral 103 shows an external address generation controller, and Reference Numeral 104 designates an internal address generation unit. Reference Numeral 105 is given to wiring conductors for connecting the external address generation unit 102 and the address output cells 101-0 to 101-31. These conductors 105 are hyphened with suffixes "0" to "31" for mutual distinction of respective bits. Reference Numerals 106, 107 and 108 show three sides of the microprocessor chip 100. The side 106 is in parallel to a data path formed on the microprocessor chip 100, and the sides 107 and 108 are orthogonal to the side 106. Reference Numeral 125 designates address output terminals of the external address generation unit 102. The address output terminals 125 of the external address generation unit 102 correspond to the address output terminal 225 in FIG. 5, and are hyphened with suffixes "0" to "31" for mutual distinction of respective bits.

In the embodiment shown in FIG. 4, the address output cells 101, the external address generation controller 103 and the internal address generation unit 104 are equivalent to the corresponding ones 301, 303 and 304 shown in FIG. 1.

As will be apparent from the above and FIGS. 4 and 5, the layout of the embodiment has the following features:

(A) The take-out point (the address output terminal 225) of the address wiring conductor 105 is located at a center of the address generation unit 102;

(B) The wiring conductor 105 extending from the address generation unit 102 can be taken out in two opposite direction (specifically, the upward vertical direction and the downward vertical direction in FIGS. 4 and 5);

(C) The external address generation unit 102 is located at one end of the data path, and the whole of the data path including the external address generation unit 102 is located near to the side of the chip 100, so that the external address generation unit 102 is positioned near to a corner of the chip 100; and (D) The address output cells are substantially uniformly distributed along two sides of the chip which define the corner which the external address generation unit 102 is positioned near to. In the shown embodiment, 17 address output cells are located along the side 108 and 15 address output cells are located along the side 106.

For example, in order to connect the output terminal 125-0 and the output cell 101-0 by the wiring conductor 105-0, a wiring conductor formed of the second level metal wiring conductor is taken out upward from the output terminal 125-0 located at the center of the unit 102, in parallel to the side 106 of the chip 100 to an outside of the unit 102, and then, the second level metal wiring conductor is connected to the first level metal wiring conductor, which extends in parallel to the side 108 toward a side opposite to the side 106, to a position of the output cell 101-0, and is bent to extend to and reach a terminal of the address output cell 101-0, in parallel to the side 106 of the chip 100, over a length corresponding to a width of a wiring area for 8 first level metal wiring conductors.

Furthermore, in order to connect the output terminal 125-17 and the output cell 101-17 by the wiring conductor 105-17, a wiring conductor formed of the second level metal wiring conductor is taken out upward from the output terminal 125-17 located at the center of the unit 102, in parallel to the side 106 of the chip 100 to an outside of the unit 102, and then, the second level metal wiring conductor is connected at the outside of the unit 102 to the first level metal wiring conductor, which extends in parallel to the side 108 toward the side 106, to a position of the output cell 101-17, and is bent to extend to and reach a terminal of the address output cell 101-17, in parallel to the side 106 of the chip 100, over a length corresponding to a width of a wiring area for 8 first level metal wiring conductors.

In addition, in order to connect the output terminal 125-18 and the output cell 101-18 by the wiring conductor 105-18, a wiring conductor formed of the second level metal wiring conductor is taken out downward from the output terminal 125-18 located at the center of the unit 102, in parallel to the side 106 of the chip 100 to an outside of the unit 102, and then, the second level metal wiring conductor is connected at the outside of the unit 102 to the first level metal wiring conductor, which extends in parallel to the side 108 toward the side 106, over a length corresponding to a width of 15 bits in the data path, to a right side of the data path. At the right side of the data path, the first level metal wiring conductor is bent to extend upward to a position of the output cell 101-18, and is further bent to extend to and reach a terminal of the address output cell 101-18, in parallel to the side 108 of the chip 100, over a length corresponding to a width of a wiring area for 8 first level metal wiring conductors.

Furthermore, in order to connect the output terminal 125-31 and the output cell 101-31 by the wiring conductor 105-31, a wiring conductor formed of the second level metal wiring conductor is taken out downward from the output terminal 125-31 located at the center of the unit 102, in parallel to the side 106 of the chip 100, to a position which is remote from the lower side of the unit 102 by a length corresponding to a width of a wiring area for 15 first level metal wiring conductors. Then, the second level metal wiring conductor is connected to the first level metal wiring conductor, which extends in parallel to the side 108 toward the side 106, to a right side of the data path. At the right side of the data path, the first level metal wiring conductor is bent to extend downward to a position of the output cell 101-31, and is further bent to extend to and reach a terminal of the address output cell 101-31, in parallel to the side 108 of the chip 100, over a length corresponding to a width of a wiring area for 8 first level metal wiring conductors.

Now, compare the floor plan of the disclosed embodiment shown in FIG. 4 with the floor plan of the conventional example shown in FIG. 1. The ratio of the longest wiring conductor 105 of the disclosed embodiment to the longest wiring conductor 305 of the conventional example is 68:174, and therefore, the length of the longest wiring conductor was shortened to 1/2.6 in the disclosed embodiment. The area of the wiring zone between the external address generation unit and the internal address generation unit is reduced to ½ in the disclosed embodiment. The ratio between the disclosed embodiment and the conventional example in the area of the wiring zone formed at the outside of the data path is 1502:2880, and therefore, the area of the wiring zone formed at the outside of the data path was reduced to 1/1.92 in the disclosed embodiment. The ratio between the disclosed embodiment and the conventional example in the total area of all the wiring zones is 2526:4992, and therefore, the total area of all the wiring zones was reduced to about ½ in the disclosed embodiment.

In other words, according to the present invention, the degree of freedom in taking out the wiring conductor from the address generation cell 200 to the address output cell 101 can be made to 2. If this freedom degree of 2 in taking out the wiring conductor is efficiently utilized by substantially equally locating the address output cells along two sides adjacent to each other, and to positioning the address generation unit 102 (including 32 address generation cells) near to the above mentioned two sides, a required wiring area can be greatly reduced.

The invention has thus been shown and described with reference to the specific embodiments. However, it should be noted that the present invention is in no way limited to the details of the illustrated structures but changes and modifications may be made within the scope of the appended claims.

In the disclosed embodiment, the present invention was applied to the external address generation unit, but can be applied to a connection between data input/output cells and a data generating and processing unit. In addition, the present invention can be applied not only to a semiconductor device constituting a microprocessor, but also other semiconductor devices such as peripheral circuit LSIs having output cells and a signal processing unit connected to these output cells. Furthermore, the present invention is not limited to the 32-bit machine, but can be applied to machines of other than 32 bits.

In addition, if it is considered that the address generation units corresponding to the output terminals 125-0 to 125-17 are included in the external address generation unit 102 located along and near to the horizontal side 108, but the units corresponding to the output terminals 125-18 to 125-31 are included in an outside of the external address generation unit 102, it can be considered that the wiring conductor (105-0 to 105-17) connecting between each of the input/output cells (101-0 to 101-17) located along the horizontal side (108) and a corresponding signal processing cell within the signal processing unit (102) is extended from the corresponding signal processing cell in a first (or upward) vertical direction toward the horizontal side (108), and the wiring conductor connecting between each of the input/output cells located along the vertical side (106) and a corresponding signal processing cell provided at the outside of the signal processing unit (102) is extended from the corresponding signal processing cell in a second (downward) vertical direction opposite to the first (upward) vertical direction.

As will be apparent from the above, in a semiconductor device formed on a semiconductor chip and including a signal processing unit composed of a plurality of signal processing cells arranged side by side in a horizontal direction, and a plurality of input/output cells each connected to a corresponding one of the signal processing cells in a one-to-one relation, the present invention is characterized in that each of the signal processing cells is configured to make it possible that a wiring conductor connecting between the signal processing cell and a corresponding one of the input/output cells can be taken out in upward and downward vertical directions from the signal processing cell. With this feature, the following advantage can be enjoyed:

(1) The area of the wiring zone within the data path can be reduced. For example, if the direction of taking out the wring conductor from the unit is equally distributed to the two directions, the area of the wiring zone in the direction of taking out the wring conductor from the unit can be reduced to a half of the number of all bits;

(2) The area of the wiring zone in the outside of the data path can be reduced. For example, if the direction of taking out the wring conductor from the unit is equally distributed to the two directions, it becomes sufficient it if a wiring zone corresponding to one fourth of the number of all bits is prepared between the data path zone and the terminal region (contact pad region);

(3) Since the increase of the chip area caused by the wiring area can be minimized, the increase of the chip cost can be suppressed;

(4) Since it is possible to prevent increase of the wiring length of the bus conductor (for example, the signal line 427) extending form an adjacent signal processing unit (for example, the internal address generation unit 304), the drop of the bus transmission rate through the bus conductor can be reduced. Alternatively, since the drop of the bus transmission rate through the bus conductor is small, the size of the output buffers within the adjacent signal processing unit can be reduced, and therefore, the area of the adjacent signal processing unit can be correspondingly reduced. This is effective in preventing the increase of the chip cost and the increase of the consumed electric power.

(5) Since the increase of the wiring length of the wiring conductor (for example, 105) can be prevented, the drop of the signal transmission rate through the wiring conductor can be reduced. Alternatively, since the drop of the transmission rate is small, the size of the output buffer within the signal generation cell (for example, the cell 200) can be reduced, and therefore, the area of the signal generation cell itself can be correspondingly reduced. This is also effective in preventing the increase of the chip cost and the increase of the consumed electric power.

(6) The difference between the longest one and the shortest one of the wiring conductors (for example, 105) can be made small, and therefore, the variation of the signal transmission rate through the wiring conductor can be correspondingly reduce. As a result, the timing design can be made easy.

I claim:

1. A semiconductor device comprising:

a semiconductor chip having at least one corner, a first side extending from said at least one corner in a first direction and a second side extending from said at least one corner in a second direction crossing said first direction;

a signal processing unit formed on said semiconductor chip and having a set of signal terminals on which a set of signals appears simultaneously, said set of signal terminals being divided into a first group of signal terminals and a second group of signal terminals;

a plurality of first cells formed on said semiconductor chip in line along said first side of said semiconductor chip;

a plurality of second cells formed on said semiconductor chip in line along said second side of said semiconductor chip;

a plurality of first wiring conductors formed on said semiconductor chip to connect each of said first group of signal terminals to an associated one of said first cells; and a plurality of second wiring conductors formed on said semiconductor chip to connect each of said second group of signal terminals to an associated one of said second cells.

2. The device as claimed in claim 1, wherein said first and second groups of signal terminals are arranged in line in said first direction, each of said first wiring conductors having a first portion extending in said second direction from an associated one of said first group of signal terminals, and each of said second wiring conductors having a second portion extending in said second direction from an associated one of said second group of signal terminals and a third portion extending in said first direction from said second portion.

3. The device as claimed in claim 2, wherein said first portion of each of said first wiring conductors extends in an opposite direction to said second portion of each of said second wiring conductors.

4. The device as claimed in claim 3, wherein said set of signals is outputted from said set of signal terminals simultaneously by said signal processing unit, and each of said cells forms an output cell which receives and transfers an associated one of said set of signals to an outside of said semiconductor chip.

5. A semiconductor device comprising:

a semiconductor chip having at least one corner, a first side extending from said at least one corner in a first direction and a second side extending from said at least one corner in a second direction crossing said first direction;

a signal processing unit formed on said semiconductor chip and having a set of signal terminals on which a set of signals appears, said set of signal terminals being divided into a first group of signal terminals and a second group of signal terminals;

a plurality of first cells formed on said semiconductor chip along said first side of said semiconductor chip;

a plurality of second cells formed on said semiconductor chip along said second side of said semiconductor chip;

a plurality of first conductors formed on said semiconductor chip to connect each of said first group of signal terminals to an associated one of said first cells; and a plurality of second conductors formed on said semiconductor chip to connect each of said second group of signal terminals to an associated one of said second cells.

6. The device as claimed in claim 5, wherein said first and second groups of signal terminals are arranged in said first direction.

7. The device as claimed in claim 6, wherein each of said first conductors include a first portion extending in said second direction from an associated one of said first group of signal terminals, and each of said second conductors include a second portion extending in said second direction from an associated one of said second group of signal terminals and a third portion extending in said first direction from said second portion.

8. The device as claimed in claim 7, wherein said first portion of each of said first conductors extends in an opposite direction to said second portion of each of said second conductors.

9. The device as claimed in claim 5, wherein said set of signals is outputted from said set of signal terminals simultaneously by said signal processing unit.

10. The device as claimed in claim 9, where each of said cells forms an output cell which receives and transfers an associated one of said set of signals to an outside of said semiconductor chip.

* * * * *